United States Patent [19]

Cummins et al.

[11] Patent Number: 4,887,299

[45] Date of Patent: Dec. 12, 1989

[54] ADAPTIVE, PROGRAMMABLE SIGNAL PROCESSING HEARING AID

[75] Inventors: Kenneth L. Cummins; Kurt E. Hecox; Malcolm J. Williamson, all of Madison, Wis.

[73] Assignee: Nicolet Instrument Corporation, Madison, Wis.

[21] Appl. No.: 120,286

[22] Filed: Nov. 12, 1987

[51] Int. Cl.[4] ...................... H04R 25/00; H03B 29/00

[52] U.S. Cl. .................................... 381/68.4; 381/68; 381/68.2; 381/71; 381/73.1; 364/518

[58] Field of Search ....................... 381/68.2, 68.4, 68, 381/106, 71, 73, 104–109

[56] References Cited

U.S. PATENT DOCUMENTS 3,180,936 4/1965 Schroeder ............................ 381/94

(List continued on next page.)

FOREIGN PATENT DOCUMENTS 67671 7/1987 Australia .
0237203 9/1987 European Pat. Off. .
2184629A 6/1987 United Kingdom .

OTHER PUBLICATIONS

"Klangum Forming Durch Computer", by K. O. Bäder and Barry A. Blesser, presented at Sound Engineer Conference, Nov. 19–22, 1975 (translation attached).

P. L. Bloom, "High-Quality Digital Audio in the Entertainment Industry: An Overview of Achievements and Challenges", IEEE ASSP Magazine, Oct. 1985, pp. 2–25.

"TMS320 First-Generation Digital Signal Processors", brochure published by Texas Instruments, Jan. 1987.

Tavares, "Nature and Application of Digital Filters", the Engineering Journal (The Engineering Institute of Canada), vol. 50, No. 1, Jan. 1967, pp. 23–27.

Brochure entitled, "The Heritage", by Zenith Hearing Aid Sales Corporation, (publication date unknown).

Rabiner, et al., "Terminology in Digital Signal Processing", IEEE Trans. Audio Electro. Acoust., vol. 20, pp. 322–337, Dec. 1972.

Bader, et al., "Programmgeseuertes Rauschfilter", Fernseh und Kino Technik, 1974, No. 8, pp. 231–233 (in German). Accompanying English translation (A Program Controlled Noise Filter).

Barfod, "Automatic Regulation Systems with Relevance to Hearing Aids", Scandinavian Audiology Supplement, (6/1978), pp. 335–378.

Mangold, et al., "Programmerbart Filter Hjalper Horselskade", Elteknik med Aktuell Elektronik, 1977, No. 15, pp. 64–66 (in Swedish). Accompanying English translation, Programmable Filter Helps Hearing Impaired People.

(List continued on next page.)

*Primary Examiner*—Jin F. Ng
*Assistant Examiner*—Danita R. Byrd
*Attorney, Agent, or Firm*—Lathrop & Clark

[57] ABSTRACT

A hearing aid system utilizing digital signal processing is programmable to fit the hearing deficit of a particular use and adaptive to the sound environment to maximize the intelligibility of the desired audio signal relative to noise. An analog signal picked from a microphone is amplified, filtered and converted to digital data. A digital signal processor preferably performs spectral shaping on the data to match the user's preference and performs a non-linear adaptive amplification function on the digital data. The amplification gain function may include several piecewise linear sections, including a first section providing expansion up to a first knee point, a second section providing linear amplification from the first knee point to a second knee point, and a third section providing compression for signals above the second knee to reduce the effort of over range signals and minimize loudness discomfort to the user. An estimate of the level of background noise is made as a function of the energy envelope of the input signal data, with the noise estimate then being used to adjust the position of the first knee up or down or to change the expansion ratio to reduce the noise component of the amplified signal supplied to the user. The digital signal processor includes a programmable read only memory which contains the desired spectral shaping characteristics and non-linear amplification characteristics suited to the user.

53 Claims, 7 Drawing Sheets

U.S. PATENT DOCUMENTS

| | | | |
|---|---|---|---|
| 3,403,224 | 9/1968 | Schroeder | 381/98 |
| 3,509,558 | 4/1970 | Cancro | 340/347 AD |
| 3,571,529 | 3/1971 | Gharib et al. | 381/68 |
| 3,784,749 | 3/1971 | Shigeyama et al. | 381/94 |
| 3,803,357 | 4/1974 | Sacks | 381/94 |
| 3,855,423 | 12/1974 | Brendzel et al. | 381/94 |
| 3,872,290 | 3/1975 | Croake et al. | 364/724 |
| 3,894,195 | 7/1975 | Kryter | 381/68.4 |
| 3,927,279 | 12/1975 | Nakamura et al. | 381/68.2 |
| 3,989,897 | 11/1976 | Carver | 381/94 |
| 3,989,904 | 11/1976 | Rohrer et al. | 381/68.4 |
| 4,025,751 | 5/1977 | Graupe et al. | 381/47 |
| 4,051,331 | 9/1977 | Strong et al. | 381/68.4 |
| 4,061,875 | 12/1977 | Freifeld et al. | 381/72 |
| 4,071,695 | 1/1978 | Flannigan et al. | 381/106 |
| 4,079,334 | 3/1978 | Hamilton | 330/279 |
| 4,099,035 | 7/1978 | Yanick | 381/68.2 |
| 4,112,254 | 9/1978 | Blackmer | 381/106 |
| 4,169,219 | 9/1979 | Beard | 369/48 |
| 4,185,168 | 1/1980 | Graupe et al. | 381/68 |
| 4,187,413 | 2/1980 | Moser | 381/68 |
| 4,188,667 | 2/1980 | Graupe et al. | 381/68.4 |
| 4,249,042 | 2/1981 | Orban | 381/106 |
| 4,297,527 | 10/1981 | Pate | 381/107 |
| 4,366,349 | 12/1982 | Adelman | 381/68.2 |
| 4,396,806 | 8/1983 | Anderson | 381/103 |
| 4,409,435 | 10/1983 | Ono | 381/68.2 |
| 4,425,481 | 1/1984 | Mansgold et al. | 381/68.2 |
| 4,454,609 | 6/1984 | Kates | 381/68 |
| 4,508,940 | 4/1985 | Steeger | 381/68.2 |
| 4,548,082 | 10/1985 | Engebretson et al. | 73/585 |
| 4,622,440 | 11/1986 | Slavin | 381/68.1 |
| 4,628,529 | 12/1986 | Borth et al. | 381/94 |
| 4,630,304 | 12/1986 | Borth et al. | 381/94 |
| 4,630,305 | 12/1986 | Borth et al. | 381/94 |
| 4,661,981 | 4/1987 | Henrickson et al. | 381/31 |
| 4,701,953 | 10/1987 | White | 381/46 |
| 4,731,850 | 3/1988 | Levitt et al. | 381/68.2 |
| 4,747,143 | 5/1988 | Kroeger et al. | 381/47 |

OTHER PUBLICATIONS

Braida, et al., "Hearing Aid—A Review of Past Research", ASHA Monographs, No. 19, 1979, pp. 54–56, section entitled Characteristics of Compression Amplifiers.

Mangold et al., "Programmable Hearing Aid with Multichannel Compression", Scandinavian Audiology 8, 1979, pp. 121–126.

Mangold, et al., "Multichannel Compression in a Portable Programmable Hearing Aids", Hearing Aid Journal, Apr. 1981, pp. 6,29,30,32.

Walker, et al., "Compression in Hearing Aids: An Analysis, A Review and Some Recommendations", National Acoustics Laboratories NAL Report, No. 30, Jun. 1982, Australian Government Publishing Service.

McNally, "Dynamic Range Control of Digital Audio Signals", J. Audio Eng. Soc., vol. 32, No. 5, May 1984, pp. 316–326.

Williamson, "Gisting Analysis", Rome Air Development Center Final Technical Report RADC-TR-84-130, Jun. 1984.

Stikvoort, "Digital Dynamic Range Compressor for Audio", J. Audio Eng. Soc., vol. 34, No. 1/2, Jan./Feb. 1986, pp. 3–9.

White, "Compression Systems for Hearing Aids and Cochlear Prostheses", Veteran's Administration Journal of Rehabilitation Research and Development, vol. 23, No. 1, 1986, pp. 25–39.

Cummins, et al., "Ambulatory Testing of Digital Hearing Aid Algorithms", RESNA 10th Annual Conference, San Jose, Calif., 1987, pp. 398–400.

ADAPTIVE, PROGRAMMABLE SIGNAL PROCESSING HEARING AID

FIELD OF THE INVENTION

This invention pertains generally to the field of audio signal processing and particularly to hearing aids.

BACKGROUND OF THE INVENTION

The nature and severity of hearing loss among hearing impaired individuals varies widely. Some individuals with linear impairments, such as that resulting from conductive hearing loss, can benefit from the linear amplification provided by conventional hearing aids using analog signal processing. Such aids may have the capacity for limited spectral shaping of the amplified signal using fixed low pass or high pass filters to compensate for broad classes of spectrally related hearing deficits. However, many types of hearing loss, particularly those resulting from inner ear problems, can result in non-linear changes in an individual's auditory system. Individuals who suffer such problems may experience limited dynamic range such that the difference between the threshold hearing level and the discomfort level is relatively small. Individuals with loudness recruitment perceive a relatively small change in the intensity of sound above threshold as a relatively large change in the apparent loudness of the signal. In addition, the hearing loss of such individuals at some frequencies may be much greater than the loss at other frequencies and the spectral characteristics of this type of hearing loss can differ significantly from individual to individual.

Conventional hearing aids which provide pure linear amplification inevitably amplify the ambient noise as well as the desired signal, such as speech or music, and thus do not improve the signal to noise ratio. The amplification may worsen the signal to noise ratio where an individual's hearing has limited dynamic range because the noise will be amplified above the threshold level while the desired speech signal may have to be clipped or compressed to keep the signal within the most comfortable hearing range of the individual.

Although hearing impaired individuals often have unique and widely varying hearing problems, present hearing aids are limited in their ability to match the characteristics of the aid to the hearing deficit of the individual. Moreover, even if an aid is relatively well matched to an individual's hearing deficit under certain conditions, such as a low noise environment where speech is the desired signal, the aid may perform poorly in other environments such as one in which there is high ambient noise level or relatively high signal intensity level.

SUMMARY OF THE INVENTION

In accordance with the present invention, digital signal processing is utilized in a hearing aid system which is both programmable to fit the hearing deficit of a particular user and adaptive to the sound environment to maximize the intelligibility and quality of the audio signal provided to the user. Background noise levels are reduced in either a fixed or an adaptive manner to enhance the signal to noise ratio of the desired signal, such as speech. The effective dynamic range of the user is expanded by maintaining high sensitivity for low intensity sound while providing long term automatic gain compression and output limiting control to insure that the sound signal does not exceed the comfort level of the wearer. The majority of normal sound signals, such as speech, are thereby provided to the user at levels which will best fit the available dynamic range of the user's ear. The audio signal provided to the user is also spectrally shaped to match and compensate for the specific spectral deficiency characteristics of the user's ear. The signal processing hearing aid further has several modes selectable at the user's choice which change the signal processing characteristics of the hearing aid to best accomodate the sound environment, such as the ambient noise level or the volume of the speech or music which the user wishes to listen to.

The signal processing hearing aid includes a microphone preferably located near or at the ear of the wearer, associated analog filtering and amplifying circuits, an analog to digital converter for converting the analog signal to digital data, a digital signal processor which operates on the digital data, a digital to analog converter for converting the processed data back to analog signal form, and analog filters and amplifiers which drive a receiver or speaker in an ear piece worn by the user. The signal from the microphone preferably receives pre-amplification and high pass filtering for pre-emphasis and is subjected to relatively slow automatic gain control to adjust the gain level to accommodate slowly varying sound levels. Anti-aliasing low pass filtering of the analog signal is performed before analog to digital conversion. In digital form, the signal data may be subjected to selectable high pass filtering and pre- and de-emphasis filtering if desired in combination with spectral shaping filtering. The spectral shaping filtering is performed in accordance with prescribed spectral characteristics matching the hearing deficit of the particular user for whom the hearing aid is prescribed. The digital signal data also has non-linear amplification performed on it so that the signal level is best matched to the expressed preference of the individual user, preferably with expansion of low level signals, normal amplification of intermediate signals, and compression of high level signals. The processed digital data is then converted back to analog form and anti-imaging low pass filtering is performed on the signal before it is amplified and delivered to the speaker. The digital signal processor preferably has a programmable read only memory which can be programmed with the desired spectral shaping characteristics and variable amplification characteristics that fit the user.

The adaptive amplification function of the digital signal processor has a non-linear input-output characteristic which may include several piecewise linear sections. For example, a first section may have a slope greater than one to provide expansion of low level signals. At a first knee point, the slope of the input-output characteristic changes to a one to one or linear input-output relationship which is maintained up to a second knee. The range of output levels between the two knees preferably corresponds to that chosen by the user, usually a best fit to the dynamic range of the user's hearing so that most of the normal speech signals between the two knees will fit into the preferred dynamic range of the user. Above the second knee, the slope of the input-output characteristic is less than one to provide compression to reduce the effect of over range signals and minimize loudness discomfort to the user. An estimate of the level of background noise is preferably made from the envelope of the input signal, with this estimate of the noise being used to adjust the position of the first knee up or down and/or change the expansion ratio of the first section to reduce the noise component of the amplified signal being supplied to the user. In accordance with the present invention, the suppression of relatively low level signals of all frequencies in this manner is found to decrease significantly the effect of ambient noise as perceived by individuals with hearing impairment. The slopes of the input-output curve above and below the knees may be changed and the initial position of the upper and lower knees may be changed in different modes of operation of the hearing aid to best accommodate the preference of the user as to the desired characteristics of the perceived sound, such as intelligibility, loudness or quality. For example, one set of slopes and knee values may be utilized in one mode while a second set of slopes and knee values may be used in another mode.

The time constants of the non-linear amplifier over which the gain remains substantially unchanged is an important characteristic which affects its performance. The longer the time constant, the less compression of short term waveform changes is achieved. However, the shorter the time constant, the more distortion is introduced for a given expansion or compression ratio. In the system of the present invention, a time constant value of about 1 to 2 milliseconds provides preferred performance. Time constants in this range allow compression up to about 3.3 to 1 and expansion down to about 1 to 2 while keeping distortion at an acceptable level. The acceptable level of distortion depends upon the user, and more compression and/or expansion are acceptable to some users.

To minimize the circuit power required and yet allow the maximum dynamic range possible in the analog to digital conversion process, a gain ranging analog to digital conversion system is preferably utilized. In this system the analog signal is supplied through a gain ranging amplifier or attenuator which has a gain controllable by the digital signal processor. The gain of the amplifier is adjusted by the digital signal processor such that the output signal from the amplifier is within a desired magnitude range. This output signal is then supplied to a linear analog to digital converter, e.g., an 8 bit converter, the output of which is then supplied as data to the digital signal processor. The processor keeps track of the gain adjustments made to the gain ranging amplifier and corrects the data received from the analog to digital converter by effectively multiplying the data from the converter by the inverse of the gain of the gain ranging amplifier at the time that the data was sampled. In this manner the dynamic range of the input data can be greatly expanded with a low power, low voltage analog to digital converter and without degrading the information in the signal since the required signal to quantization noise ratio for the hearing aid system is much less than the dynamic range required.

Further objects, features, and advantages of the invention will be apparent from the following detailed description when taken in conjunction with the accompanying drawings.

DESCRIPTION OF THE PREFERRED EMBODIMENT

Figure 1:
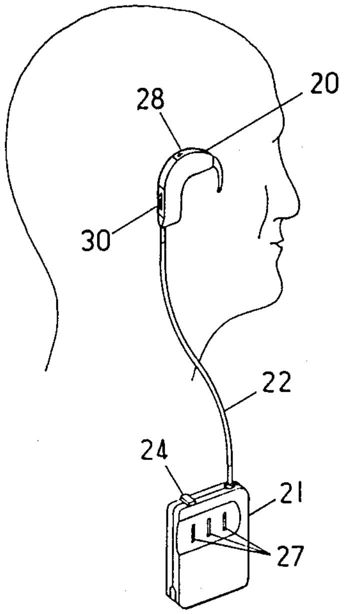
FIG. 1 is an illustrative view showing the major components of the adaptive signal processing hearing aid of the present invention as worn by a user.

An illustrative view of one style of an adaptive, programmable signal processing hearing aid in accordance with the present invention is shown generally in FIG. 1, composed of an ear piece 20 and a body aid or pocket processing unit 21 which are connected by a wiring set 22. It is, of course, apparent that the hearing aid can be incorporated in various standard one piece packages, including behind-the-ear units and in-the-ear units, depending on the packaging requirements for the various components of the aid and power requirements. As explained further below, the pocket processing unit 21 includes a power on-off button 24, and mode control switches 27. The mode switches 27 can optionally provide selection by the user of various operating strategies for the system which suit the perceived preference of the user. The mode switches allow the user to select the mode which best suits his subjective perception of the sound from the aid. As explained further below, the hearing aid system is programmable to adapt the signal processing functions carried out in each of the modes to the hearing deficit of the user for whom the hearing aid is prescribed. A volume control dial 28 is also provided on the ear piece 20 to allow user control of the overall volume level.

Figure 2:
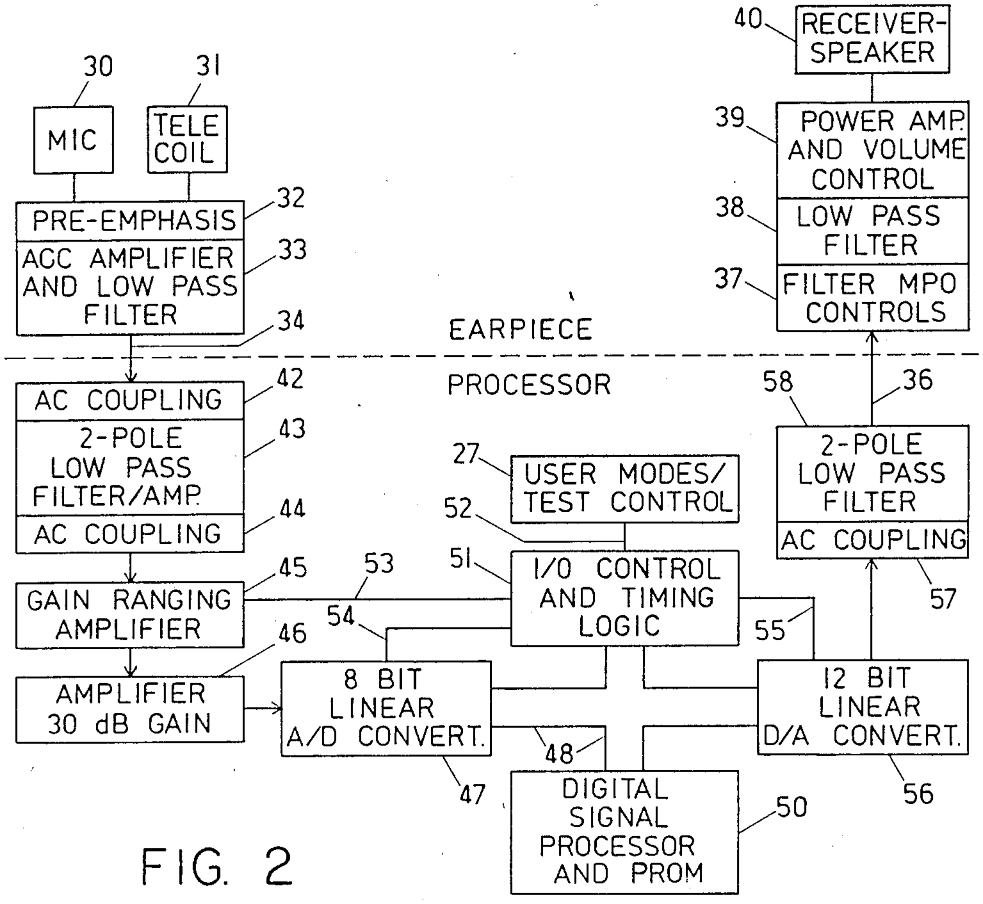
FIG. 2 is a schematic block diagram of the hardware components of the adaptive signal processing hearing aid of the invention.

A hardware block diagram of the ear piece unit 20 and pocket processor unit 21 is shown in FIG. 2. The ear piece includes a microphone 30 which can be of conventional design (e.g., Knowles EK3027 or Lectret SA-2110), preferably. The ear piece may also optionally include a telecoil 31 to allow direct coupling to audio equipment. The output signal from the microphone 30 or telecoil is provided to an analog pre-amplifier/pre-emphasis circuit 32 which amplifies the output of the microphone (or telecoil) and provides some high pass filtering (e.g., 6 dB per octave) to provide a frequency spectrum flattening effect on the incoming speech signal which normally has a 6 dB per octave amplitude roll off. This pre-emphasis serves to make the voiced and unvoiced portions of speech more equal in amplitude, and thus better suited to subsequent signal processing. In particular, the pre-emphasis reduces the dynamic range of the speech signal and so reduces the number of bits needed in the analog to digital converter. The output of the pre-amplifier/pre-emphasis circuit is provided to an automatic gain control circuit and low pass filter 33. The automatic gain control (AGC) circuit attempts to maintain the long-term root-mean-square (RMS) input level at or below a specified value to minimize dynamic range requirements for the analog to digital converter which is used to convert the analog signal to a digital signal. Preferably, RMS inputs below 70–75 dB SPL (at 4 kHz) are amplified linearly with about 40 dB gain, resulting in a 45 mV RMS signal level (e.g., 0.125 V peak to peak for a 4 kHz sine wave) which will be provided to the analog to digital converter. Inputs between 75 dB and 95 dB are maintained at the 45 mV level for the long term average. Inputs above 95 dB preferably have a gain less than 15 dB, and will be hard-clipped at the one volt peak to peak level. However, it is apparent that the total gain received by the listener can be selected either more or less than these values depending on the subsequent digital signal processing and the analog output stage.

To minimize the interaction between speech modulation (syllabic) and the AGC circuit, the attack time is preferably approximately 300 milliseconds (msec) and the release time is approximately 2.5 seconds. This long term AGC function is desirable to allow the total gain to the user to be automatically adjusted to provide a comfortable listening level in situations where the user can control the signal level but not the noise level, for example in using the car radio, watching television in a noisy environment, and so forth.

The output of the automatic gain control circuit is provided on signal lines 34 (forming part of the connecting line 22) to the main body or pocket processor unit 21. The ear piece also receives an output signal on lines 36 from the pocket processor. This signal is received by a maximum power output control circuit 37 which is adjusted by the fitter. The signal then is provided to a low pass filter 38 and a power amplifier and volume control circuit 39 and finally to the receiver transducer or speaker 40 (e.g., Knowles CI-1762) for conversion to a corresponding sound. The analog output power amplifier (e.g., an LTC 551 from LTI, Inc.) determines the overall system gain and maximum power output, each of which can be set by a single component change. The output of this amplifier is preferably hard limited to protect against malfunctions.

The signal on the line 34 from the ear piece is received by the pocket processor through an AC coupler 42 and is passed to a two pole low pass filter amplifier 43 and thence through an AC coupler 44 to a gain ranging amplifier 45 (e.g., Analog Devices AD 7118). The output of the gain ranging amplifier 45 is provided to a 30 dB gain amplifier 46 which provides its output to a linear analog to digital converter 47 (e.g., an eight bit converter such as Analog Devices AD 7575). The A to D converter 47 is connected to provide its digital output to the data bus 48 of a digital signal processor 50 which may include a microprocessor, a random access memory and a programmable read only memory (PROM) for storing the program and the prescribed parameters adapting the hearing aid to a particular patient. An example of a suitable signal processor is a TMS 320E15 from Texas Instruments. The digital signal processor data bus is also connected to input/output control and timing logic 51 which is connected to the user mode control switches 27 by control lines 52, by control lines 53 to the gain ranging amplifier 45, and by a control line 54 to the analog to digital converter 47. The control logic is also connected by a control line 55 to a 12 bit linear digital to analog converter 56 which is also connected to the data bus 48 of the digital signal processor. The analog output from the D to A converter 56 (e.g., an Analog Devices AD 7545 and a current to voltage converter) is provided through AC coupling 57 to a 2 pole low pass filter 58 which delivers the filtered output signal on the lines 36 to the ear piece. The amplifiers and filters may utilize, for example, TLC27M operational amplifiers and the logic circuitry is preferably 74 HC series for low power operation.

Figure 3:
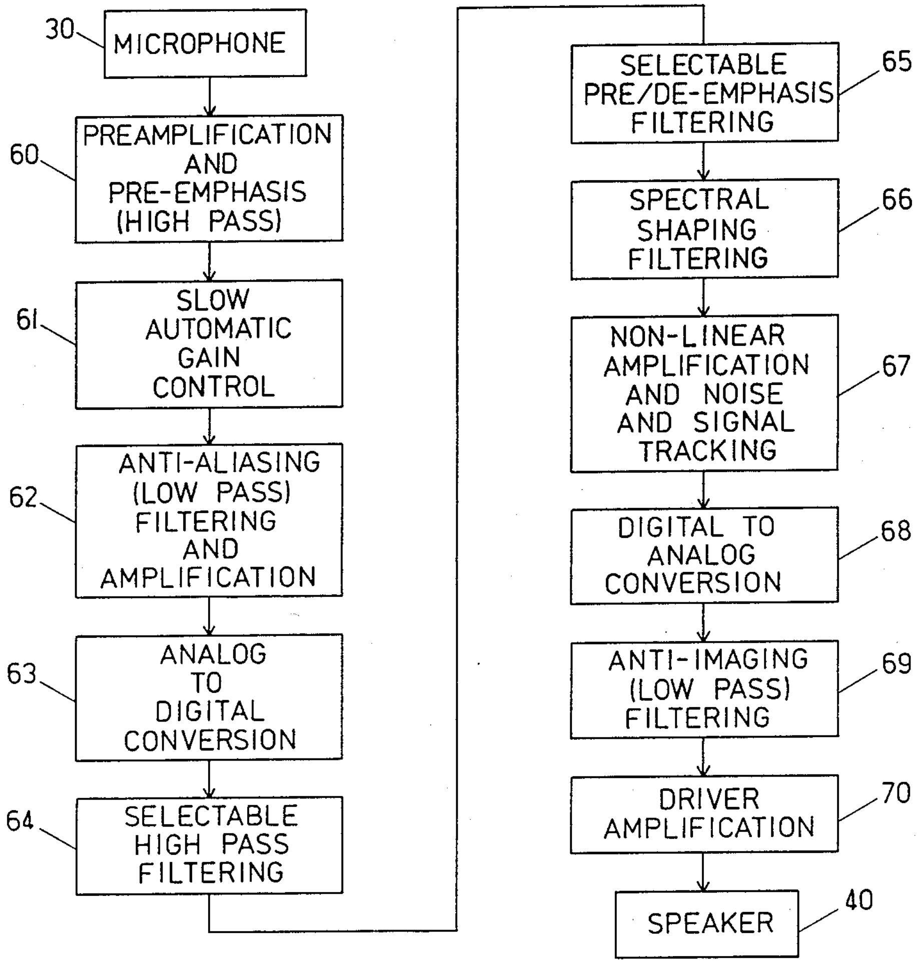
FIG. 3 is a signal flow diagram showing the operations performed on the signals from the microphone to the speaker in the hearing aid of the invention.

The spectral shaping of the sound signal to best compensate for the user's hearing deficit and the desired amplitude compression and noise reduction are carried out in the digital signal processing components. A flow diagram of a preferred embodiment for signal flow through the hearing aid system is shown in FIG. 3. The input signal from the microphone 30 is initially preamplified and provided with pre-emphasis, preferably at 6 dB per octave (block 60) which is carried out by the pre-emphasis circuit 32, and then has slow automatic gain control performed on the amplified and pre-emphasized signal (block 61) which is performed in the AGC amplifier and filter section 33. The gain control signal is then passed through an anti-aliasing low pass filter (block 62) after which the analog signal is converted to digital data (block 63). The low pass anti-aliasing filtering is performed both in the AGC amplifier and low pass filter circuit 33 and in the 2 pole low pass filter and amplifier 43 to reduce the higher frequency content of the signal to minimize aliasing. For example, if the analog to digital conversion is performed at 14,000 samples per second, the anti-aliasing filtering preferably substantially attenuates signal power above about 7,000 Hz.

After analog to digital conversion, the processing of the signal is carried out digitally in the digital signal processor 50. The digital data is first subjected to a selectable high pass filtering step (block 64) which, if used, has a high pass frequency of about 100 Hz to filter out DC components of the signal and thereby get rid of DC offsets that may exist in the data.

The data is then optionally subjected to a selectable pre or de-emphasis filtering (block 65). If pre-emphasis is selected, the filtering is flat to about 1 kHz and then rises at 6 dB per octave above that. De-emphasis is flat to about one kHz and falls at 6 dB per octave above that. A further option is no filtering at all. The choice between the filter options is made on the basis of the general shape of the patient's audiogram and subjective decisions made by the user during the fitting process.

The filtered data is then subjected to spectral shaping filtering (block 66). The spectral filter provides shaping of the gain spectrum to match the individual who will be using the aid and to provide an acoustic equalization function for the entire system. The shaping filter allows, e.g., up to 12 dB per octave of gain control with up to 36 dB of total shaping. It is possible to obtain the desired shaping to within 3 dB over the 500 Hz to 6 kHz range. The filter is constructed preferably to flatten out any undesired resonances in the acoustic pathway, for example those caused by the ear hook and tubing. This provides a more natural sound and greater immunity to acoustic feedback. The conventional approach to dealing with the resonance problem is to use acoustic filters which have the problem of changing characteristics due to moisture and contaminants.

The spectrally shaped data from the shaping filter is then operated on by an adaptive non-linear amplification function (block 67). In general terms this function can be described as having an input-output curve which is tailored to the individual and which has regions of increasing gain (expansion), constant gain (linear operation) and decreasing gain (compression). By utilizing signal and noise tracking functions, the entire input-output curve or portions of it can change shape and position to best control noise, maintain comfortable loudness of the signal, and prevent uncomfortable loudness of intense sounds. The characteristics of this function, and its interaction with the spectral shaping in the prior filter sections, determines how the input signal and noise levels are transformed to output signals and noise levels across the frequency range. The rapid release time of the amplifier helps to improve intelligibility of quiet sounds following loud transients. More particularly, the system allows tracking of long term signal and noise levels and the use of estimates of these levels to maintain the output speech sound at a level which will be comfortable to the user while simultaneously controlling noise.

After completion of the digital signal processing, the digital data is converted to an analog signal (block 68) in the digital to analog converter 56 and the converted signal is subjected to anti-imaging low pass filtering (block 69) carried out by the filters 58 and 38, to minimize imaging introduced by the digital to analog conversion. Finally the filtered signal is subjected to power amplification (block 70) in the power amplifier circuit 39 and is passed to the receiver or speaker 40.

Figure 4:
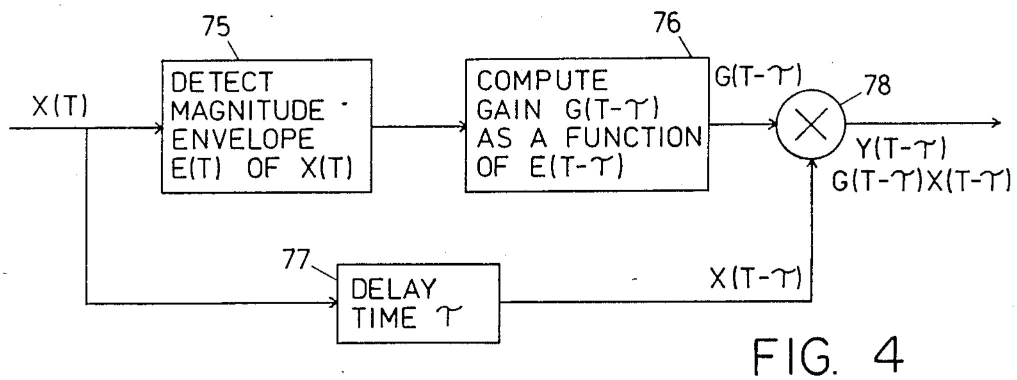
FIG. 4 is an illustrative block diagram showing the operation of the adaptive non-linear amplifier as carried out by the digital signal processor of the hearing aid of the invention.

A block diagram showing the basic functional operations of the adaptive non-linear amplification function 67 is shown in FIG. 4 as implemented on the sampled digital data at sample times "T", with the incoming signal data provided to the adaptive amplification function being represented as X(T). The energy magnitude envelope E(T) of X(T) is first detected, for example by performing an RMS calculation over a short sample period or by other measures of the magnitude envelope such as absolute value followed by low pass filtering. Using the estimate E(T) of the energy magnitude envelope, the gain G is computed as a function of the estimate E. Because of the delays required to perform the magnitude envelope calculations and to compute the gains, a gain is computed for a sample taken at a time several microseconds (or clock periods) earlier and the input signal X(T) is delayed by the time delay period so that the calculated gain and the delayed data when multiplied together at 78 will be properly functions of the same points in time, yielding output data $Y(T-\tau)$ which forms the output data from the digital signal processor. Utilizing this non-linear amplification system, the desired input-output compression function can be implemented, as described below.

Figure 5:
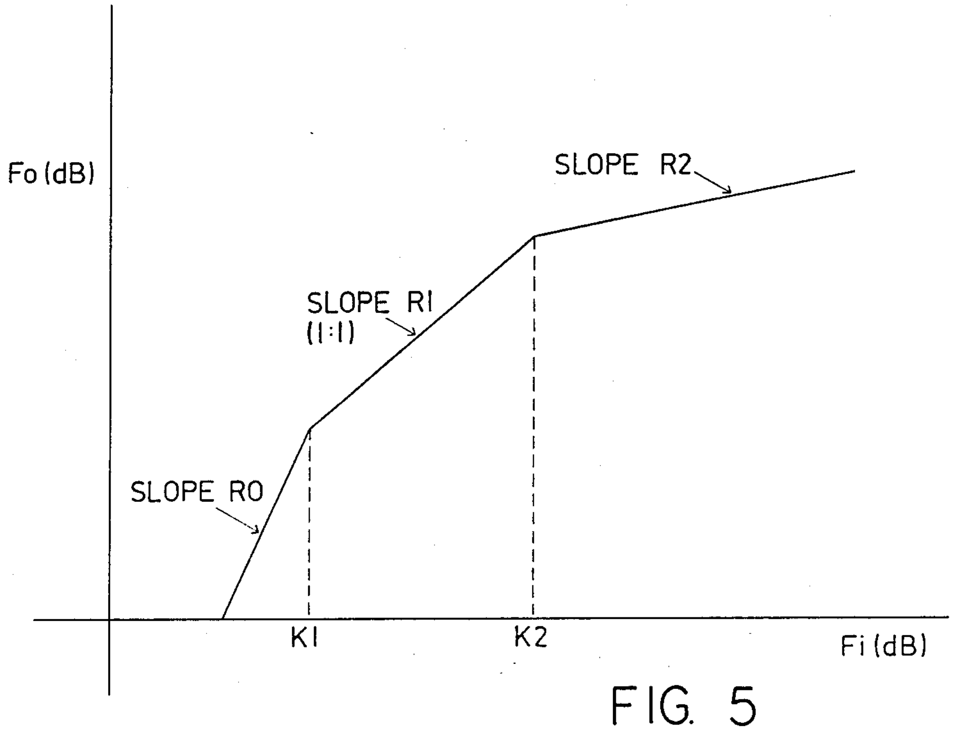
FIG. 5 is a graph showing the input-output characteristics of the adaptive non-linear amplifier.

The operation of the non-linear amplifier can be most readily illustrated by assuming it receives a time varying input signal x(t) and provides a time varying output signal y(t), with the internal operations of the amplifier being performed on the digital input X(T) and yielding the digital output Y(T). By denoting $F_i$ as the log magnitude envelope (in dB) of the input signal x(t) and $F_o$ (in dB) as the log magnitude envelope of the output signal y(t), a preferred input-output relationship between $F_i$ and $F_o$ which may be implemented by the amplifier is shown in FIG. 5. At low input signal levels, the adaptive amplifier provides increasing gain to the input signal, i.e., the slope RO of the $F_i-F_o$ curve is greater than one (expansion). This allows low level background noise to be attenuated relative to the speech signal. As the magnitude of the input signal goes above a selected level, denoted K1 in FIG. 5, the slope of the next piecewise linear $F_i-F_o$ curve segment is R1, which is preferably one. This gives a normal constant amplification for signals which have a magnitude, for example, in the normal speech range. Preferably, the gain function is selected for an individual user so that these input signals in the normal speech range will map to output signals from the hearing aid which are within the preferred dynamic range of the user's hearing. For signals above a higher selected magnitude, denoted K2 in FIG. 5, the slope R2 of the piecewise linear segment of the gain curve is less than one, resulting in compression of the output signal. The level of K2 is preferably selected so that signals which will exceed the sound level at which the wearer is most comfortable will be compressed. The three piecewise linear segments for the input-output curve of FIG. 5 thus together serve to provide expansion of weak signals, normal amplification of normal speech signals, and compression of strong signals. Additional piecewise linear segments may be used if desired, and the curve may also be implemented with nonlinear segments and discontinuities. The three piecewise linear segment implementation is generally sufficient to provide adequate adaptation to the entire range of signal levels.

The input-output gain function of FIG. 5 is implemented using the adaptive amplifier of FIG. 4 with the energy magnitude envelope E(T) serving as an estimate of the magnitude of the input signal X(T) at a time T calculated over a sample period during which the actual magnitude of the signal is assumed to be relatively constant. At the time T, the three piecewise linear segments of the input-output curve of FIG. 5 can be represented by the following equations wherein $L(T)=20\log E(T)$:

$$\text{For } L(T) < K1\text{: } Fo = A + L(T) + (RO-1)[L(T)-K1]$$
$$\text{For } K1 \leqq L(T) \leqq K2\text{: } Fo = A + L(T)$$
$$\text{For } K2 < L(T)\text{: } Fo = A + L(T) + (R2-1)[L(T)-K2]$$

where A is a constant basic gain in dB.

If H(T) is the magnitude envelope of the output signal y(t) at the time T, then $Fo=20\log H(T)$.

For the amplifier of FIG. 4, (for each sample time T)

$$Y(T)=G(T)\,X(T).$$

Therefore, averaging values over a short time period:

$$H(T) = G(T)\,E(T)$$

$$\text{and } 20\log H(T) = 20\log G(T) + 20\log E(T)$$

The equations above for the input-output segments can thus be written as:

$$20 \log G(T) = A + (R0 - 1)(20 \log E(T) - K1)$$

$$20 \log G(T) = A$$

and $$20 \log G(T) = A + (R2 - 1)(20 \log E(T) - K2)$$

Figure 6:
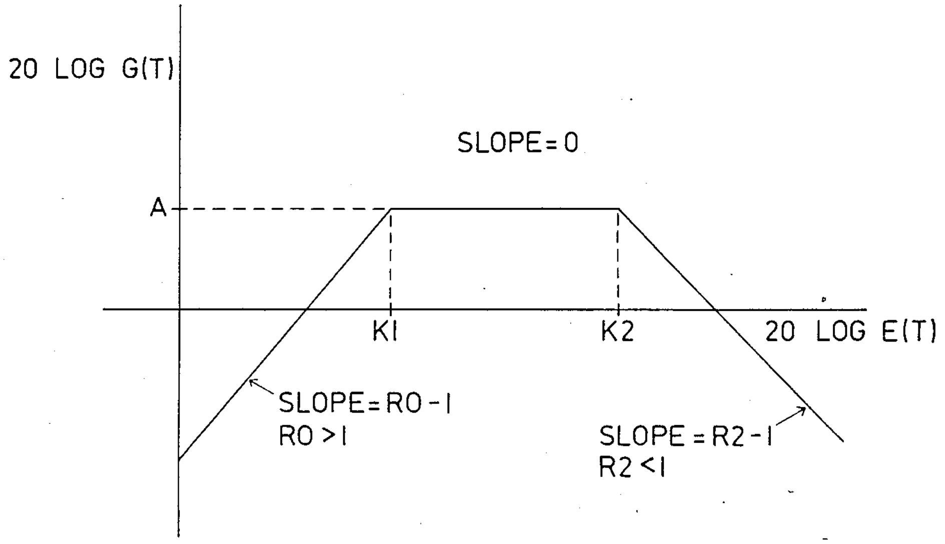
FIG. 6 is a graph showing the relationship between estimated energy in the input signal and the gain of the adaptive non-linear amplifier of the invention.

A plot of the gain function 20 log G(T) verses 20 log E(T) is shown in FIG. 6.

These equations can also be expressed in non-logarithmic form as:

$$G(T) = 10^{A/20}\left[\frac{E(T)}{10^{K1/20}}\right]^{(R0-1)}$$

for $E(T)$ less than $10^{K1/20}$, $$G(T) = 10^{A/20}$$

and $$G(T) = 10^{A/20}\left[\frac{E(T)}{10^{K2/20}}\right]^{(R2-1)}$$

for $E(T) > 10^{K2/20}$.

These gain equations are implemented in the programming for the digital signal processor, as described below.

Figure 7:
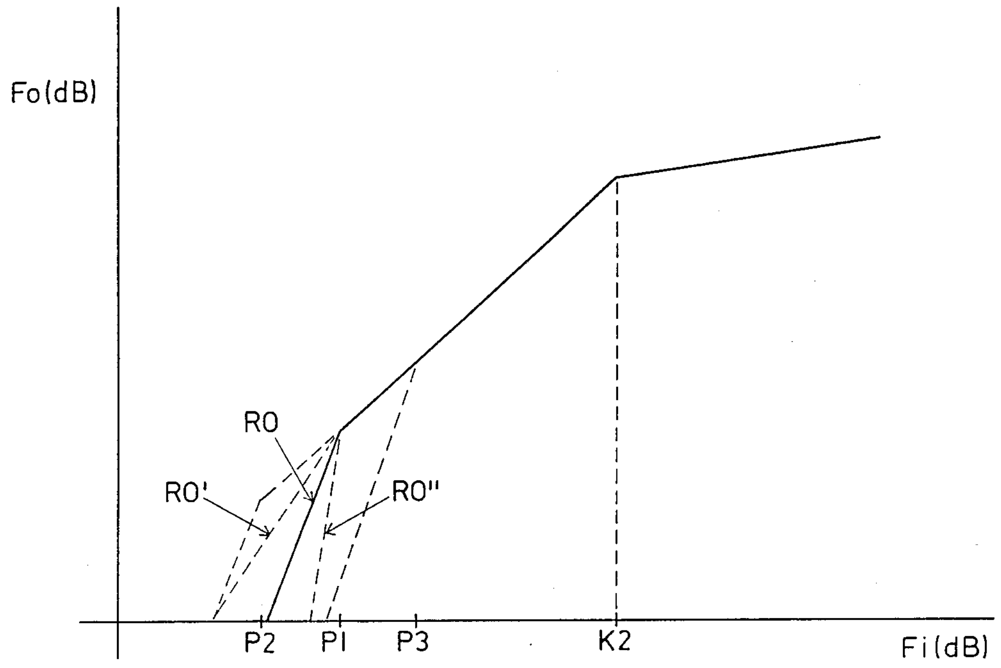
FIG. 7 is a graph similar to that of FIG. 5 showing the effect of a change in the lower knee level as a result of changes in the background noise level in the signal received by the adaptive amplifier.

To best adapt to changing noise and signal levels, the positions of the knees K1 and K2 in FIG. 5, as well as the slopes of the piecewise linear segments can be varied as a function of the various estimates of signal and noise taken from the energy envelope estimate E(T). With reference to FIG. 7, the position of the first knee may be changed smoothly from positions P1 to P2 to P3 depending on the level of noise to best suppress the noise, on the assumption that the noise is lower than the speech level. This is found to be generally a reasonable assumption, and by suppressing the low level noise in this manner, significant increases in the perceptibility of speech signals in the presence of noise are obtained without regard to the spectral content of the noise. The position of the lower expansion knee changes with a noise estimate NX(T) Preferably, this noise estimate changes very slowly, so that it can be thought of as a fixed knee which changes as the background noise level changes. In the preferred embodiment of the present invention, the knee K1 is placed at a fixed height (e.g., about 15 dB) above the noise estimate. Provided that the speech to noise ratio is better than 15 dB, the speech peaks will be unaffected and so the perceived loudness of the speech is not changed. However, as the position of the knee moves outwardly from, for example, a nominal level of P1 to P3 as the noise level increases, the noise will be within the expansion portion of the piecewise linear curve which will reduce the noise by up to 15 dB. As noise decreases, the knee may drop from the nominal level to a lower level P2 to enhance the lower level speech signals. Preferably, the expansion knee level will be selected so that only a small amount of the speech signal falls in the range below the expansion knee to minimize distortion of the speech. The position of the knee with respect to the noise level can be set individually for a user if he or she requires more noise suppression or can tolerate less speech distortion. The position of the second knee K2 remains fixed, as do the slopes of the gain function segments.

Alternatively or in addition to changing the position of the knee K1, the slope of the expansion section below K1 can be changed to minimize noise. For example, the slope of this section (and thus the expansion ratio) can change in direct relation to the noise level estimate to suppress the effective noise level, e.g., from R0 to R0′ to R0″.

Figure 8:
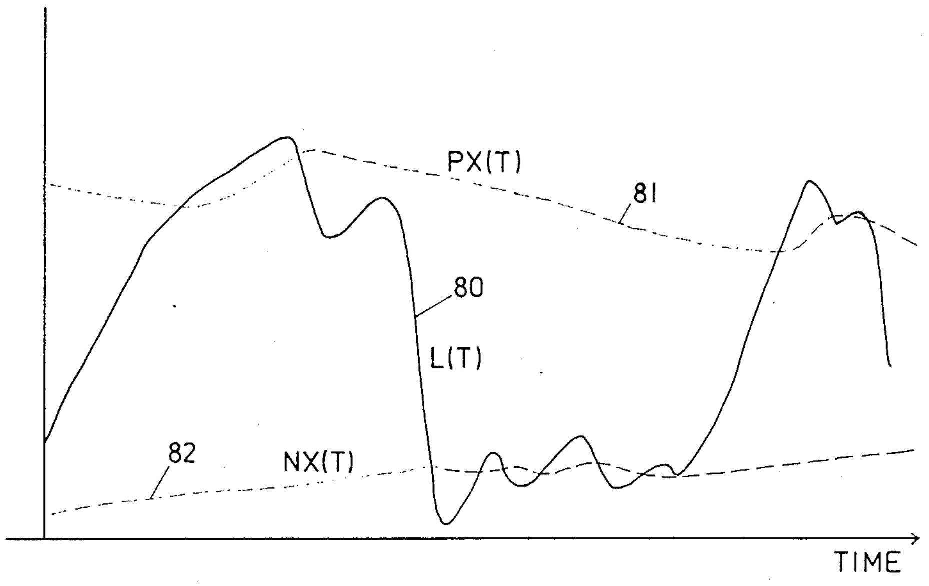
FIG. 8 is a graph illustrating the changes in the amplitude envelope of a typical signal received by the adaptive amplifier and the manner in which the noise and peak levels of the signal are estimated.

FIG. 8 illustrates the preferred manner in which the estimates NX(T) and PX(T) of noise and peak levels are obtained from the log magnitude envelope L(T) of the signal, wherein the log spectrum is estimated by the envelope estimator E(T). As shown in FIG. 8, as the log magnitude envelope, represented by the graph labeled 80 in FIG. 8, changes in level, the peak level estimator, indicated by the graph 81, and the noise level estimator, indicated by the graph 82, slowly change. Preferably the noise estimate tracks about the eleventh percentile of the distribution of the (or, equivalently, the distribution of the energy envelope) log spectrum energy envelope values and the peak estimate tracks about the eighty-ninth percentile. The rates of change are slow enough to track the noise level in pauses in speech and the speech peaks, without significant modulation caused by pauses in continuous speech.

Figure 9:
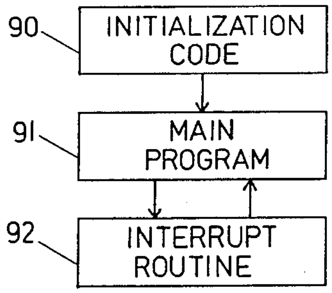
FIG. 9 is a flow chart showing the program blocks for implementation of the program utilized by the digital signal processor.
Figure 10:
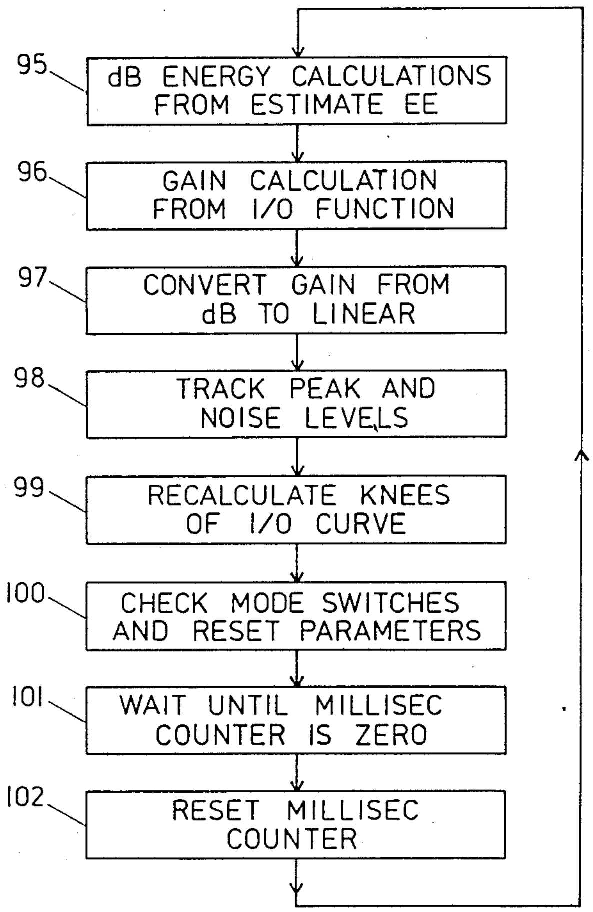
FIG. 10 is a flow chart showing the main program in the processing system of FIG. 9.
Figure 11:
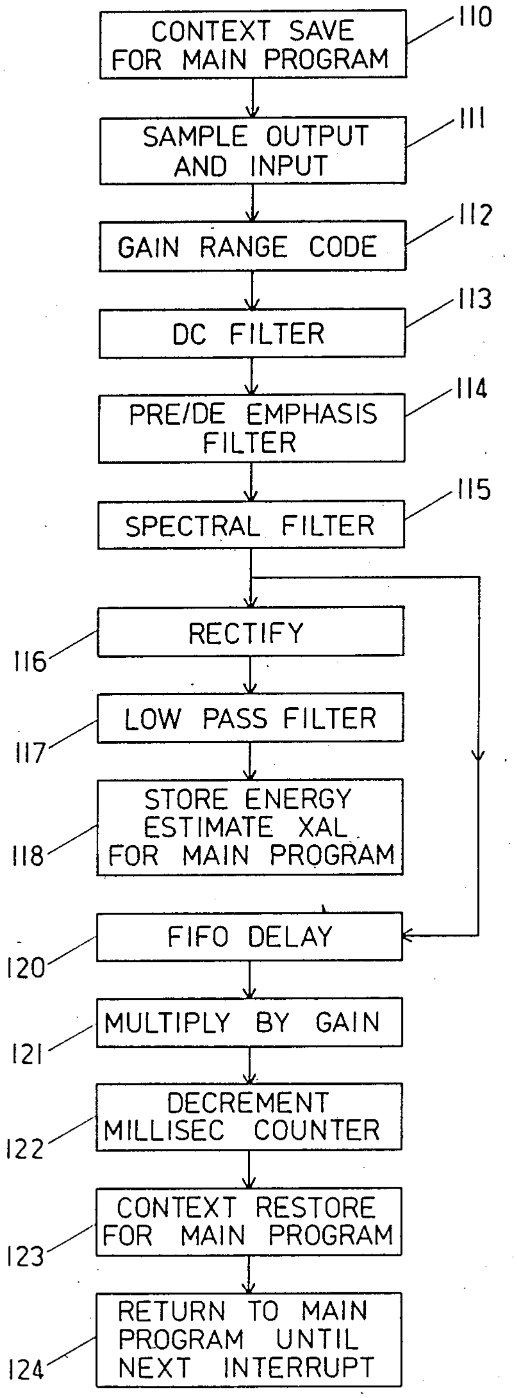
FIG. 11 is a flow chart showing the interrupt routine in the processing system of FIG. 9.

The program operations carried out by the digital signal processor in accordance with the present invention are shown in the flow charts in FIGS. 9–11. With reference to FIG. 9, the program algorithms fall into three sets. First is the initialization code (block 90) which is executed at the time of power-up. Second, is the main program (block 91) which is a continuously executed loop. Third, there is an interrupt routine (block 92) which is executed once for each input sample and communicates back and forth with the main program.

The initialization code sets any constants which are needed in the other routines and does any initialization of input-output ports which is needed. The main program uses the energy estimate "xa1" (corresponding to E(T) as described above) from the interrupt routine to calculate a gain value "gmul" (corresponding to G(T) as described above) for the adaptive non-linear amplifier. The energy estimate is also preferably used to track noise levels and may be used to track peak levels. The user switches are also checked during the main loop and, if they are changed, the appropriate parameters are reset. The breaking up of the calculations between a main program and an interrupt routine is preferred for reasons of efficiency. The gain calculation, performed in the main program, does not need to be redone for every input sample. Thus, a significant proportion of the computation time is saved which results in a lower required clock rate for the processor and commensurate power savings in the system.

The main program for the implementation of the present invention is shown in FIG. 10 and is a continuously circulating loop algorithm. Beginning at block 95, the dB energy calculation is made from the estimate "xa1", which is a conversion from a magnitude scale (the output of the low pass filter in the interrupt code) to a logarithmic decibel scale. While several program implementations are possible, the preferred implementation uses logic to find the exponent of the algorithm and a look-up table for the mantissa. For convenience in calculations in the computer program, the computation of the dB energy level "loglev" from the energy estimate "xa1" is done by computing the logarithm of xa1 to the base 2. This can be written in equivalent code as:

loglev := 16 * log2 (xa1)

After computation of the dB energy estimate loglev, the gain calculation from the input-output function is carried out (block 96). The gain function can take several possible forms. A preferred form is that shown in FIG. 5 where there is expansion with a ratio rat0 below a knee level K1, linear gain between the knee K1 and a second knee K2, and compression with a ratio rat2 above K2. For this gain function, the calculated gain "loggain" would be:

$$\text{loggain} := (\text{loglev} - K2) * (\text{rat2} - 1) \text{ if } K2 < \text{loglev}$$

$$\text{loggain} := 0 \quad \text{if } K1 \leqq \text{loglev} \leqq K2$$

$$\text{loggain} := (\text{loglev} - K1) * (\text{rat0} - 1) \text{ if loglev} < K1$$

The preferred values for rat0 and rat2 are 2.0 and 0.3, giving an expansion of 1:2 and a compression of 3.3:1. Many other values could be used for these ratios, with a tradeoff occurring between the amount of distortion which is acceptable for a user and the degree of compression or expansion that would be suitable. The values of the knees K1 and K2 can be fixed or either or both can depend upon the current estimated signal and noise levels. When the knee K2 is fixed, it is preferred to set it to a value corresponding to speech peaks. When the knee K1 is fixed it is based upon user preference in the fitting procedure. It is apparent that many other forms of input-output functions are possible, for example utilizing more knees to divide the input range into more than three segments each with different expansion or compression ratios. In this manner, any shape of input-output curve can be approximated by a piecewise linear function.

After the gain has been calculated at 96, the gain is converted at 97 from a log scale to a linear scale by using a look-up table and the result is stored as a variable "gmu1" for use in the interrupt routine. The effective code for this conversion is:

gmu1 := 2**(loggain/16)

The peak and noise levels are then tracked (block 98). The peak and noise levels are initially assigned arbitrary values and then are adjusted according to the following formulas:

peak: = peak + pu if loglev > peak
peak: = peak − pd if loglev < peak
noise: = noise + nu if loglev > noise
noise: = noise − nd if loglev < noise It does not matter which formulas are performed when loglev is exactly equal to peak or loglev is exactly equal to noise, since the values will correct themselves at the next calculation time. In a steady state case, peak and noise will settle down to some percentile of the distribution of the loglev values. Which percentile, and how fast the estimates will react to a change in loglev level, is determined by the values of pu, pd, nu, and nd. Preferred values are such that pu and nd correspond to 80 dB per second and pd and nu correspond to 10 dB per second. These values cause the noise estimate to track the 11th percentile of the loglev values and the peak estimate to track the 89th percentile of the loglev values. The rates are slow enough to track the noise level in pauses in speech and the speech peaks without excessive modulation caused by pauses in continuous speech.

After completion of the recalculation of the peak and noise levels at 98, the knees of the input-output curve are recalculated (block 99). The knees K1 and K2 can be fixed or they can depend upon the estimated peak and noise levels. In one mode selected by the mode switch, both knees K1 and K2 are fixed and in another position the first knee K1 is variable and the second knee K2 is fixed. For the variable knee K1, the formula is:

K1 := noise + nsplus

The value of K1 is limited preferably to lie in a range between K1min and K1max where the minimum and maximums are set in accordance with user preference during the fitting procedure. The value nsplus is a height above the noise level at which the knee K1 is placed. From testing in a variety of noise environments, a value of nsplus corresponding to 15 dB is preferred.

The main program then goes on to check mode switches and reset parameters (block 100). The switches are checked to see whether they have been pressed and, if they have, the parameters corresponding to that switch are read and replace the existing parameters in the algorithm. Exemplary preferred parameters which can be reset are:

- K2 -- the higher knee of the input output curve
- K1min -- the minimum value for the lower knee
- K1max -- the maximum value for the lower knee,
- rat0 -- the expansion/compression ratio below knee k1
- rat2 -- the expansion/compression ratio above knee k2
- wgain -- the gains for the 5 bands in the spectral filter
- nsplus --the level above the noise at which the knee k1 is placed.

After completion of the check of the mode switches and the resetting of parameters, the program then waits until the millisecond counter is less than or equal to zero (block 101). This counter is decremented in the interrupt routine. After the counter reaches zero or less than zero, the millisecond counter is reset (block 102) to a positive number. The number governs how often the main program is executed. For example, if it is desired to execute the main program about once every millisecond, the millisec counter is set to a number (e.g., 15) which accomplishes that result.

The interrupt routine is shown in FIG. 11 and begins at 110 by storing the current program counter, registers and processor status as is usual in interrupt routines. Next, the sample input x0(t) is read from the analog to digital converter and the output, designated x6(t), is sent to the digital to analog converter (block 111). The sample output x6(t) actually corresponds to a data point which was taken at an earlier time and manipulated through the interrupt routine. Next, the gain range code is executed (block 112). The input level is adjusted, depending upon the current setting of the attenuator. This is done so that the original signal level is restored, accomplished according to the formula:

x1(t) := xO(t) * rmu1

The factor rmul is the amount (inverse of attenuation) by which the attenuator has attenuated the signal in the gain ranging analog to digital conversion circuit. In addition, the attenuator setting may be adjusted if desired. If the incoming sample x0(t) is greater than half full scale, then the attenuation for subsequent samples is increased by 6 dB. If the samples have all been below a quarter full scale for the last 32 samples, then the attenuation is decreased by 6 dB. By these means, the signal level is kept within range of the A to D converter, with sufficient resolution to give a low quantization noise floor.

After the gain ranging code has been executed, an optional DC filter may be implemented (block 113). The output x2(t) of the filter is a high pass filtered version of the input x1(t) to eliminate any DC offset in the signal. The optional filter has a preferred high-pass frequency of about 100 Hz. A preferred formula for implementing the high-pass filter in the program is:

$$x2(t) := x1(t) - dc$$

$$dc := dc + x2(t)/16$$

If the filter is, optionally, not implemented, then x2(t) :=x1(t).

An optional pre-emphasis/de-emphasis filter (block 114) may then be utilized. There are three options for the filter, which has an input x2(t) and an output x3(t). The options are pre-emphasis, flat output, and de-emphasis. The pre-emphasis filter is flat to about 1 kHz and rises at 6 dB octave above that. The de-emphasis filter is flat to about 1 kHz and falls at 6 dB per octave above that. The choice between the filters is made on the basis of the general shape of the patient's audiogram. The possible options can be implemented as:

$$x3(t) := x3(t-1)*7/8 + x2(t)*1/2, \text{ for de-emphasis}$$

$$x3(t) := x2(t), \text{ for flat}$$

$$x3(t) := x2(t)*2 - x2(t-1)*7/4 \text{ for pre-emphasis}$$

A spectral shaping filter (block 115) is then applied to the output of the pre-emphasis/de-emphasis filter. The filter provides shaping of the gain spectrum. An example of one filter, a finite impulse response (FIR) type, is described below. The length of the filter depends on how detailed the shaping must be to fit the particular user of the aid. In a preferred embodiment, a 31 long symmetrical filter is used giving an output x4(t) from the input x3(t) in accordance with the formula:

$$x4(t) := \text{sum over } i[x3(t-1)*\text{coef}(i)] \text{ for } i = 0 \ldots 30$$

The coefficients may be made symmetrical, that is, coef(i)=coef(30-i). By making these coefficients symmetrical, a filter is created with flat group delay. The filter may be controlled by 5 parameters, the gains in 5 bands centered at 250 Hz, 500 Hz, 1 kHZ, 2 kHz and 4 kHZ. The initialization code sets constants and variables in the program including the filter coefficients coef[i](i=0. . .15). The filter formed is calculated from the gains wgain[i] (i=1. . .5). The filter formed is a weighted sum of 5 filters $$coef[i] = wgain[1]*cl[i] + wgain[2]*c2[i] + wgain[3]*c3[i] + wgain[4]*c4[i] + wgain[5]*c5[i] \text{ for } i = 0 \ldots 15$$

The filters c1 thru c5 are bandpass filters which could be designed in several different ways. A preferred method is a Kaiser design giving filters with center frequencies 250 Hz, 500 Hz, 1 kHz, 2 kHz, 4 kHz. The design depends upon the sampling rate and what scaling is given to the numbers for hardware reasons. For a sampling rate of 14 kHz and a scaling factor of 4096 we get the following filters. These are the coefficients c1[i] (i =0. . .15), the filters are 31 long with coef[30-i]=coef[i].

| | | | | | | | |
|---|---|---|---|---|---|---|---|
| c5 filter | 4 kHz | | | | | | |
| −1 | 0 | 4 | 5 | −11 | −22 | 14 | 61 |
| 7 | −121 | −86 | 192 | 300 | −250 | −1227 | 2272 |
| c4 filter | 2 kHz | | | | | | |
| 23 | 5 | −43 | −58 | −11 | 24 | −14 | −25 |
| 123 | 298 | 160 | −337 | −681 | −350 | 442 | 864 |
| c3 filter | 1 kHz | | | | | | |
| 16 | 67 | 124 | 160 | 151 | 84 | −34 | −174 |
| −292 | −346 | −308 | −176 | 18 | 222 | 375 | 432 |
| c2 filter | 500 Hz | | | | | | |
| −127 | −154 | −172 | −180 | −176 | −158 | −129 | −90 |
| −43 | 10 | 62 | 111 | 154 | 188 | 209 | 217 |
| c1 filter | 250 Hz | | | | | | |
| 48 | 63 | 79 | 95 | 111 | 126 | 141 | 156 |
| 169 | 181 | 191 | 200 | 207 | 212 | 215 | 216 |

The output of the filter is rectified at a block 116, which may be implemented as simply an absolute value xa of x4(t) as follows:

xa :=abs( x4(t) )

Alternatively, a square could be used to obtain a slightly more accurate estimate of the root-mean-square signal level.

The output of the rectifier 116 is passed to a low pass filter 117 which acts on xa to give output xa1. Various low pass filters are possible, but a preferred embodiment uses a single-pole low pass filter with a cut-off frequency of 1 kHz:

xa1 :=xa1+(xa−xa1)/tc

In the foregoing formula, tc is a time constant measured in samples. Preferred values of the time constant tc are 16 or 32. Powers of 2 are preferred because they can be implemented easily by shifts. The energy estimate xa1 is then stored for use later by the main program (bloc 118).

The output data from the filter, x4(t), is also provided to a first-in-first-out delay (block 20) in which the signal x4(t) is delayed in a first-in-first-out queue to give an output x5(t). The delay is used to balance the delay in the low pass filter so that changes in signal level do not happen before the compression or expansion can occur, in accordance with the following formula:

$$x5(t) := x4(t - tc)$$

where tc is the same time constant used in the low pass filter 117 used to calculate the energy estimate xa1.

The output signal x5(t) from the FIFO delay 120 is then multiplied by the gain, gmu1, as calculated in the main program (block 121) in accordance with the formula:

$$x6(t) := x5(t) * gmu1$$

In the next step in the interrupt program the millisecond counter is decremented (block 122) in accordance with the formula:

counter:=counter−1 and the registers and processors status are then restored for main program execution (block 123), and the program returns to the main program until the next interrupt (block 124). At this point the program counter is restored to the value at the start of the interrupt and the main program is restarted.

If a sampling rate of 14 kHz is utilized in the analog to digital converter, there will be approximately 70 microseconds between samples available for execution of the program if an interrupt is carried out every sample. The interrupt program must be completed between each sample. For example, if 62 microseconds are needed to do the interrupt program between each sample, approximately 8 microseconds are left for execution by the main program, so that the main program will be executed in total over several samples. As noted above, if it is desired to complete the execution of the main program once approximately every millisecond, the main program will then be executed once approximately every 15 samples.

In the digital processing of many types of signals, the dynamic range requirement is much greater than the signal to (quantization) noise ratio requirement. Audio signals, both speech and music, are examples of such signals. It is a specific object of the present invention to develop an efficient, low power, low voltage data conversion system which is applicable to signals having band widths below about 20 kHz, particularly a digital signal processing system for the hearing impaired where approximately an 72 dB input dynamic range is required but only a 30 dB input signal to noise ratio is required.

A preferred embodiment of a conversion system which requires significantly less circuit power and circuit complexity to implement than traditional data converters with comparable dynamic range is shown in FIG. 2 composed of the gain ranging amplifier 45, the 30 dB gain amplifier 46 and the 8 bit linear analog to digital converter 47. These units operate under the control of the digital signal processor 50 through the control and timing logic 51. In the processing of speech dominated audio signals, the rate at which large signal changes take place is relatively slow, and the gain ranging amplifier 45 can be utilized to extend the dynamic range of the (e.g., 8 bit) analog to digital converter 47. As long as the rate at which large signal changes take place is below the rate of change for the gain of the gain ranging amplifier, such an approach can be utilized. In such speech audio applications, it is found that the gain change rates can be limited to 6 db per 150 microseconds for gain decreases and 6 dB per millisecond for gain increases and still provide the necessary dynamic range and signal to noise ratio. Generally 8 bits of linear analog to digital conversion capability are required for such an approach.

The gain control algorithm used to control the gain ranging amplifier (or digital attenuator 45) is that if the magnitude of the digital sample from the 8-bit linear analog to digital converter 47 exceeds $2^6$ (64) for any sample, then the gain of the gain ranging amplifier 45 will be reduced by a factor of 2 by the digital signal processor 50. Conversely, if the sample value is less than $2^5$ (32) in one millisecond, then the gain of the amplifier 45 will be increased by a factor of two. This computation is carried out by the digital signal processor in the Gain Range Code block 112 in the single band algorithm interrupt routine.

Figure 12:
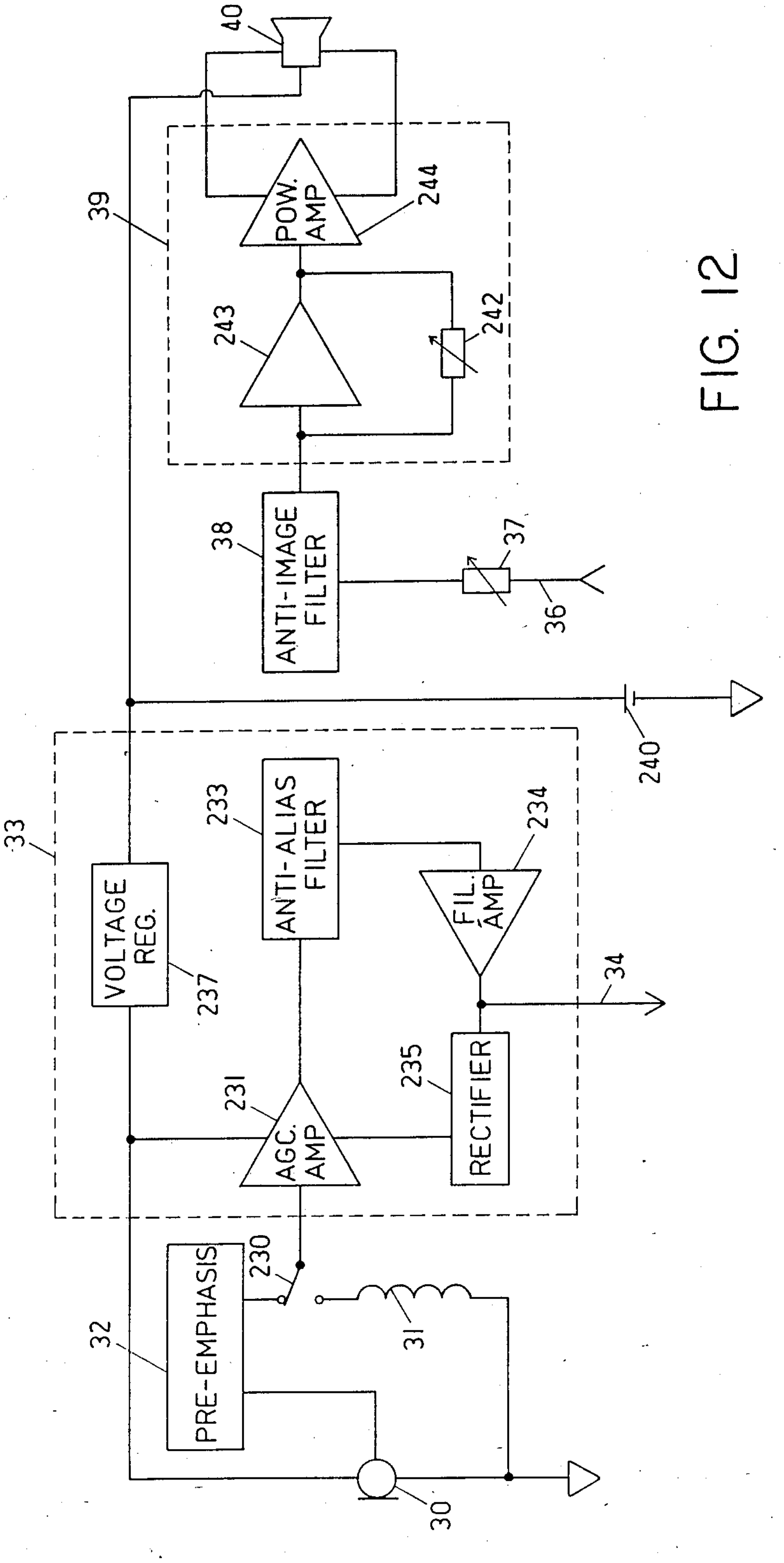
FIG. 12 is a schematic block diagram showing the hardware components of the ear piece portion of the hearing aid system of the present invention.

A somewhat more detailed block diagram of the ear piece circuit portion of the hearing aid is shown in FIG. 12. A switch 230 allows the input to be taken either from the microphone 30 through the pre-emphasis circuit 32 or from the telecoil 31. The input signal goes into the circuit 33 which includes an automatic gain control amplifier 231, the output of which is received by the low pass anti-aliasing filter 233. The output of the filter 233 is passed through a filter amplifier 234 and is provided on the line 34 to the digital signal processing components in the processor unit. The output of the filter 234 is also provided to a rectifier 235 which feeds back to the AGC amplifier 231 to control its output level. The AGC amplifier receives its power (as does the microphone 30) from a voltage regulator 237 which is supplied from a low voltage battery source 240 in the ear piece.

The signal on the lines 36 from the pocket processor portion of the hearing aid is received in the ear piece and passed through an adjustable attenuator 37 which is adjusted by the hearing aid fitter, and thence the signal passes through the anti-imaging filter 38 to the power amplifier section 39 which drives the receiver speaker 40. The power amplifier section 39 is supplied directly with power from the voltage source 240 and includes a voltage adjustment 242 operated by the dial 28 which controls the gain of an amplifier 243 which, in turn, supplies the power amplifier 244.

As noted above, it is a particular advantage of the present hearing aid system that the hearing aid can be programmed to adapt to the hearing deficit of a particular user. The fitting procedure determines the values of several parameters of the hearing aid algorithm. The patient's hearing may first be tested by standard audiological methods to determine thresholds and other standard parameters. The individual being tested may then be supplied with a master hearing aid which is a computer based processor running the same algorithms as the hearing aid. The patient goes through a protocol in which speech (sometimes with noise added) is provided to him or her. The master hearing aid processor then executes the hearing aid algorithms and switches between different sets of parameters. The patient then indicates his or her preference (or the subjective intelligibility) of the signal by pressing buttons on the master hearing aid. The information from the buttons is stored back into the computer. Several possible procedures may be utilized to take a set of parameters so determined and reach an optimal set by making small changes and paired comparisons. One such procedure is the simplicial method.

The fitting is preferably done in both quiet conditions and with noise added to the speech. The patient may well require different parameter sets under these different conditions. The three positions of the selection switch on the hearing aid allows up to three different sets of parameters to be provided for normal use. During execution of the code by the digital signal processor in the hearing aid, the switches are checked to determine whether they have been pressed, and if they have, the parameters corresponding to the switch that is pressed are read and replace those parameters previously in the algorithm. As noted above, among the parameters which preferably can be read and changed for each position of the mode switches are K2, the higher position of the higher knee of the input-output curve; K1min, the minimum value for the lower knee position; K1max the maximum value for the lower knee; rat0, the expansion/compression ratio below the knee K1; rat2, the expansion/compression ratio above the knee K2; wgains, the gains in the five bands which form the shaping filter; and nsplus, the level above the noise to place the knee K1.

It is understood that the invention is not confined to the particular embodiments set forth herein, but embraces all such modified forms thereof as come within the scope of the following claims.

What is claimed is:

1. A digital signal processing hearing aid system comprising:

(a) input means for providing an electrical signal corresponding to a sound signal;

(b) analog to digital converter means for converting the signal from the input means to digital data;

(c) digital signal processing means for receiving the digital data from the analog to digital converter means and providing processed output data and including a programmable memory selectably loaded with processing variables adapted to an individual user, the digital signal processing means including non-linear amplification means for providing digital output data which is a function of the time varying digital input signal data and a gain function of an estimated energy envelope of the digital input signal data, the gain function including at least a section providing expansion for selected low level input signals, a linear amplification section for providing constant amplification for intermediate level input signals, and a section providing compression for high level input signals, wherein the digital signal processing means further includes means for estimating the level of noise of the digital input signal data, and wherein a knee dividing the expansion section of the gain function from the linear section is moved higher or lower as a function of the noise level estimate while the position of the knee at which the linear section joins the compression section remains fixed and unaffected by the noise level estimate;

(d) digital to analog converter means for converting the data processed by the digital signal processing means to an analog signal; and (e) means for converting the analog signal to a corresponding sound.

2. The hearing aid system of claim 1 wherein the processing variables in the programmable memory include the slopes of the expansion section and the compression section of the non-linear amplification means, and the digital signal data energy envelope magnitude positions of the knees at which the expansion section joins the linear amplification section and at which the linear amplification section joins the compression section.

3. The hearing aid system of claim 1 wherein the digital signal processing means includes means for spectrally shaping the digital input signal data to provide spectrally shaped output data which is selected to compensate for the spectral hearing deficit of a user and wherein that output data is provided as input data to the non-linear amplification means.

4. The hearing aid system of claim 1 wherein the means for estimating the level of noise estimates the level of noise as a function of the energy envelope of the digital input signal data.

5. The hearing aid system of claim 1 further including anti-aliasing low pass filter means for filtering the analog signal from the input means prior to supplying the analog signal to the analog to digital converter means to filter out frequencies in the signal which are above one half the sampling rate of the analog to digital converter means.

6. The hearing aid system of claim 1 including anti-imaging low pass filter means for filtering the signal from the digital to analog converter means to eliminate high frequency components introduced in the signal as a result of the digital to analog conversion before supplying the analog signal to the means for converting.

7. The hearing aid system of claim 1 further including a variable amplifier receiving the analog signal from the input means, and connected to the digital signal processing means to be controlled thereby to provide an output signal to the analog to digital converter means which is at a selected range of magnitudes under the control of the digital signal processing means, and wherein the analog to digital converter means includes a linear analog to digital converter receiving the output of the variable amplifier and providing its digital output data to the digital signal processing means, and wherein the variable amplifier means is controlled by the digital signal processing means to provide an attenuation factor to the output signal therefrom by which the analog signal is adjusted in magnitude and wherein the digital signal processing means corrects the data from the analog to digital converter to provide digital data which is indicative of the true magnitude of the analog input signal to the variable amplifier, thereby extending the dynamic range capability of the linear analog to digital converter beyond the bit output capacity of the analog to digital converter.

8. The hearing aid system of claim 4 wherein the programmable memory in the digital signal processing means is provided with parameters that define the minimum and maximum values for the position of the knee dividing the expansion section of the gain function from the linear section and wherein the digital signal processing means moves the knee higher or lower as a function of the noise level estimate but within the limits set by the minimum and maximum values.

9. The hearing aid system of claim 1 including automatic gain control means for controlling the magnitude of the analog signal passed from the input means to the analog to digital converter means, the signal magnitude controlled at a slow rate relative to speech to be within a desired range of magnitudes.

10. The hearing aid system of claim 1 wherein the non-linear amplification means has a piecewise linear gain function in which the logarithm of the gain is a linearly increasing function of the logarithm of the energy envelope up to a first knee, a constant between the first and a second knee, and a linearly decreasing function above the second knee.

11. The hearing aid system of claim 10 wherein the positions of the first and second knees are selected so that the constant gain between the first and second knee lies over a preferred dynamic range for the hearing of the individual user.

12. The hearing aid system of claim 10 wherein the digital signal processing means includes means for estimating the level of noise as a function of the energy envelope of the digital input signal data.

13. The hearing aid system of claim 12 wherein the position of the first knee is set equal to the noise level estimate plus a selected constant.

14. The hearing aid system of claim 12 wherein the first knee is moved higher or lower in direct relation to the noise level estimate but no higher than a selected maximum value and no lower than a selected minimum value.

15. The hearing aid system of claim 14 wherein the programmable memory is provided with parameters that define the minimum and maximum values for the position of the first knee, the position of the second knee, and the slopes of the gain function.

16. The hearing aid system of claim 14 wherein the position of the first knee is set equal to the noise level estimate plus a selected constant.

17. The hearing aid system of claim 12 wherein the means for estimating the level of noise estimates the noise level by tracking a selected percentile of the distribution of the energy estimate.

18. The hearing aid system of claim 1 including pre-emphasis filtering means for equalizing the frequency spectrum of the analog signal passed from the input means to the analog to digital converter means to minimize the required dynamic range of the analog to digital converter means.

19. The hearing aid system of claim 1 wherein the gain function is determined periodically by the digital signal processing means with a time constant in the range of about one millisecond to about two milliseconds.

20. The hearing aid system of claim 10 wherein the section of the gain function up to the first knee provides an expansion ratio of up to 1:2 and the section above the second knee provides a compression ratio of up to 3.3:1.

21. A digital signal processing hearing aid system comprising:

(a) input means for providing an electrical signal corresponding to a sound signal;

(b) analog to digital converter means for converting the signal from the input means to digital data;

(c) digital signal processing means for receiving the digital data from the analog to digital converter means and providing processed output data, the digital signal processing means including non-linear amplification means for providing digital output data which is a gain function of the time varying digital input signal data and a function of an estimated energy envelope of the digital input signal data, the function including at least a section providing expansion for selected low level input signals up to a first knee and a linear amplification section for providing constant amplification for intermediate level input signals above the first knee, and further including means for estimating the level of noise as a function of the energy envelope of the digital input signal and for moving the first knee higher or lower as a function of the noise level estimate while keeping the portion of the gain function above the first knee fixed and unaffected by the noise level estimate;

(d) digital to analog converter means for converting the data processed by the digital signal processing means to an analog signal; and (e) means for converting the analog signal to a corresponding sound.

22. The hearing aid system of claim 1 further including anti-aliasing low pass filter means for filtering the analog signal from the input means prior to supplying the analog signal to the analog to digital converter means to filter out frequencies in the signal which are above one half the sampling rate of the analog to digital converter means.

23. The signal processing hearing aid of claim 21 including anti-imaging low pass filter means for filtering the signal from the digital to analog converter means to eliminate high frequency components introduced in the signal as a result of the digital to analog conversion before supplying the analog signal to the means for converting the analog signal to a corresponding sound.

24. The signal processing hearing aid system of claim 21 further including a variable amplifier receiving the analog signal from the input means and connected to the digital signal processing means to be controlled thereby to provide an output signal to the analog to digital converter means which is at a selected range of magnitudes under the control of the digital signal processing means, and wherein the analog to digital converter means includes a linear analog to digital converter receiving the output of the variable amplifier and providing its digital output data to the digital signal processing means, and wherein the variable amplifier means is controlled by the digital signal processing means to provide an attenuation factor to the output signal therefrom by which the analog signal is adjusted in magnitude and wherein the digital signal processing means corrects the data from the analog to digital converter to provide digital data which is indicative of the true magnitude of the analog input to the variable amplifier, thereby extending the dynamic range capability of the linear analog to digital converter beyond the bit output capacity of the analog to digital converter.

25. The hearing aid system of claim 21 wherein the digital signal processing means includes a programmable memory and wherein the programmable memory is provided with parameters that define the minimum and maximum values for the position of the first knee and wherein the digital signal processing means moves the first knee higher or lower as a function of the noise level estimate but within the limits set by the minimum and maximum parameters.

26. The hearing aid system of claim 21 including automatic gain control means for controlling the magnitude of the analog signal passed from the input means to the analog to digital converter means, the signal magnitude controlled at a slow rate relative to speech to be within a desired range of magnitudes.

27. The signal processing hearing aid system of claim 21 wherein the non-linear amplification means has a piecewise linear gain function in which the logarithm of the gain is a linearly increasing function of the logarithm of the energy envelope up to a first knee, a constant between the first knee and a second higher knee position, and a linearly decreasing function above the second knee.

28. The hearing aid system of claim 27 wherein the position of the first and second knees are selected so that the constant gain between the first and second knees lies over a preferred dynamic range for the hearing of the individual user.

29. The hearing aid system of claim 27 wherein the digital signal processing means moves the first knee higher or lower as a function of the noise level estimate while the position of the second knee and the slopes of the gain function remain fixed.

30. The hearing aid system of claim 29 wherein the position of the first knee is set equal to the noise level estimate plus a selected constant.

31. The hearing aid system of claim 29 wherein the first knee is moved higher or lower in direct relation to the noise level estimate but no higher than a selected maximum value and no lower than a selected minimum value.

32. The hearing aid system of claim 31 wherein the position of the first knee is set equal to the noise level estimate plus a selected constant.

33. The hearing aid system of claim 29 wherein the means for estimating the level of noise estimates the noise level by tracking a selected percentile of the distribution of the energy estimate.

34. The hearing aid system of claim 21 including pre-emphasis filtering means for equalizing the frequency spectrum of the analog signal passed from the input means to the analog to digital converter means to minimize the required dynamic range of the analog to digital converter means.

35. The hearing aid system of claim 21 wherein the gain function is determined periodically by the digital signal processing means with a time constant in the range of about one millisecond to about two milliseconds.

36. The hearing aid system of claim 27 wherein the section of the gain function up to the first knee provides an expansion ratio of up to 1:2 and the section above the second knee provides a compression ratio of up to 3.3:1.

37. A digital signal processing hearing aid system comprising:

(a) input means for providing an electrical signal corresponding to a sound signal;

(b) analog to digital converter means for converting the signal from the input means to digital data;

(c) digital signal processing means for receiving the digital data from the analog to digital converter means and providing processed output data, the digital signal processing means including non-linear amplification means for providing digital output data which is a gain function of the time varying digital input signal data and a function of an estimated energy envelope of the digital input signal data, the function including at least a section providing expansion for selected low level input signals up to a first knee and a linear amplification section for providing constant amplification for intermediate level input signals above the first knee, and further including means for estimating the level of noise as a function of the energy envelope of the digital input signal and for changing the expansion ratio of the expansion section as a function of the noise level estimate while keeping the portion of the gain function above the first knee fixed and unaffected by the noise level estimate;

(d) digital to analog converter means for converting the data processed by the digital signal processing means to an analog signal; and (e) means for converting the analog signal to a corresponding sound.

38. The signal processing hearing aid system of claim 37 further including anti-aliasing low pass filter means for filtering the analog signal from the input means prior to supplying the analog signal to the analog to digital converter means to filter out frequencies in the signal which are above one half the sampling rate of the analog to digital converter means.

39. The signal processing hearing aid of claim 37 including anti-imaging low pass filter means for filtering the signal from the digital to analog converter means to eliminate high frequency components introduced in the signal as a result of the digital to analog conversion before supplying the analog signal to the means for converting the analog signal to a corresponding sound.

40. The signal processing hearing aid system of claim 37 further including a variable amplifier receiving the analog signal from the input means and connected to the digital signal processing means to be controlled thereby to provide an output signal to the analog to digital converter means which is at a selected range of magnitudes under the control of the digital signal processing means, and wherein the analog to digital converter means includes a linear analog to digital converter receiving the output of the variable amplifier and providing its digital output data to the digital signal processing means, and wherein the variable amplifier means is controlled by the digital signal processing means to provide an attenuation factor to the output signal therefrom by which the analog signal is adjusted in magnitude and wherein the digital signal processing means corrects the data from the analog to digital converter to provide digital data which is indicative of the true magnitude of the analog input to the variable amplifier, thereby extending the dynamic range capability of the linear analog to digital converter beyond the bit output capacity of the analog to digital converter.

41. The hearing aid system of claim 37 including automatic gain control means for controlling the magnitude of the analog signal passed from the input means to the analog to digital converter means, the signal magnitude controlled at a slow rate relative to speech to be within a desired range of magnitudes.

42. The signal processing hearing aid system of claim 37 wherein the non-linear amplification means has a piecewise linear gain function in which the logarithm of the gain is a linearly increasing function of the logarithm of the energy envelope up to a first knee, a constant between the first knee and a second higher knee position, and a linearly decreasing function above the second knee.

43. The hearing aid system of claim 42 wherein the position of the first and second knees are selected so that the constant gain between the first and second knees lies over a preferred dynamic range for the hearing of the individual user.

44. The hearing aid system of claim 37 wherein the means for estimating the level of noise estimates the noise level by tracking a selected percentile of the distribution of the energy estimate.

45. The hearing aid system of claim 37 including pre-emphasis filtering means for equalizing the frequency spectrum of the analog signal passed from the input means to the analog to digital converter means to minimize the required dynamic range of the analog to digital converter means.

46. The hearing aid system of claim 37 wherein the gain function is determined periodically by the digital signal processing means with a time constant in the range of about one millisecond to about two milliseconds.

47. The hearing aid system of claim 42 wherein the section of the gain function up to the first knee provides an expansion ratio of up to 1:2 and the section above the second knee provides a compression ratio of up to 3.3:1.

48. A method for reducing the effect of noise in a digital signal processing hearing aid comprising the steps of:

(a) receiving a sound signal and converting the sound signal to digital data;

(b) providing nonlinear amplification for the digital data which includes a gain function of the time varying digital input signal data as a function of an estimated energy envelope of the digital input signal data, the function including at least a section providing expansion for selected low level input signals up to a first knee and a linear amplification section for providing constant amplification for intermediate level input signals above the first knee;

(c) estimating the level of noise in the digital signal data; and (d) moving the first knee higher as the noise level estimate increases and lower as the noise level estimate decreases without affecting the gain function above the first knee, thereby to increase the level below which expansion of signals occurs as noise levels increase to reduce the effective background noise levels and to decrease the level below which expansion occurs as noise levels decrease so as to enhance the non-noise signal.

49. The method of claim 48 wherein the step of providing nonlinear amplification provides a piecewise linear gain function in which the logarithm of the gain is a linear increasing function of the logarithm of the energy envelope up to a first knee, a constant between the first knee and a second higher knee position, and a linearly decreasing function above the second knee.

50. The method of claim 49 wherein the positions of the first and second knees are selected so that the constant gain between the first and second knees lies over a preferred dynamic range for the hearing of the individual user.

51. The method of claim 48 wherein the noise is estimated as a function of the energy level of the digital input signal and in the step of the moving the first knee the position of the first knee is set equal to the noise level estimate plus a selected constant.

52. The method of claim 48 wherein the noise is estimated as a function of the energy level of the digital input signal and in the step of moving the first knee higher or lower the first knee is moved in direct relation to the noise level estimate but no higher than a selected maximum value and no lower than a selected minimum value.

53. The method of claim 48 wherein in the step of estimating the level of noise the noise is estimated by tracking a selected percentile of the distribution of the energy estimate of the digital input signal.

* * * * *

UNITED STATES PATENT AND TRADEMARK OFFICE
CERTIFICATE OF CORRECTION

PATENT NO. : 4,887,299

DATED : December 12, 1989

INVENTOR(S) : Kenneth L. Cummins; Kurt E. Hecox; Malcolm J. Williamson

It is certified that error appears in the above-identified patent and that said Letters Patent is hereby corrected as shown below:

ON THE TITLE PAGE:

In the Abstract of the patent, line 3, "use" should be --user--.

Column 9, line 20 after "$G(T) = 10^{A/20}$," add a new line --for $10^{k1/20} \leq E(T) \leq 10^{k2/20}$--.

Column 9, line 45, "NX(T)" should be --NX(T).--.

Column 15, lines 23-28, "and the registers and processors status are then restored for main program execution (block 123), and the program returns to the main program until the next interrupt (block 124). At this point the program counter is restored to the value at the start of the interrupt and the main program is restarted." should be in standard print.

Signed and Sealed this

Thirty-first Day of August, 1993

Attest:

BRUCE LEHMAN

*Attesting Officer*

*Commissioner of Patents and Trademarks*